(12) United States Patent
Oda et al.

(10) Patent No.: US 7,019,279 B2
(45) Date of Patent: Mar. 28, 2006

(54) SOLID-STATE IMAGE SENSOR WITH THE OPTICAL CENTER OF MICROLENSES SHIFTED FROM THE CENTER OF PHOTO-SENSORS FOR INCREASING THE CONVERGENCE RATIO

(75) Inventors: Kazuya Oda, Asaka (JP); Hirokazu Kobayashi, Asaka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 112 days.

(21) Appl. No.: 10/698,393

(22) Filed: Nov. 3, 2003

(65) Prior Publication Data

US 2004/0089788 A1 May 13, 2004

(30) Foreign Application Priority Data

Nov. 7, 2002 (JP) .............................. 2002-323859

(51) Int. Cl.
*H01J 3/14* (2006.01)
*H01J 40/14* (2006.01)
*H01J 5/16* (2006.01)

(52) U.S. Cl. ................... 250/216; 250/208.1; 348/275
(58) Field of Classification Search ............. 250/208.1, 250/216; 348/275, 294, 302, 315
See application file for complete search history.

(56) References Cited

U.S. PATENT DOCUMENTS

| | | | |
|---|---|---|---|
| 5,610,390 A * | 3/1997 | Miyano | 250/216 |
| 6,777,661 B1 * | 8/2004 | Summa et al. | 250/208.1 |
| 6,831,692 B1 * | 12/2004 | Oda | 348/315 |
| 6,850,277 B1 * | 2/2005 | Misawa | 348/275 |
| 2004/0125226 A1 * | 7/2004 | Kubo | 348/340 |

* cited by examiner

*Primary Examiner*—David Porta
*Assistant Examiner*—Patrick J. Lee
(74) *Attorney, Agent, or Firm*—Birch, Stewart, Kolasch & Birch, LLP

(57) ABSTRACT

A solid-state image sensor includes a photosensitive array capturing an optical image representative of a desired scene. The photosensitive array includes photo-sensors arranged in a direction of row and a direction of column, and microlenses each causing incident light to converge to the corresponding photo-sensor. Each photo-sensor corresponds to a particular pixel included in the photosensitive array. Each photo-sensor is made up of a higher- and a lower-sensitivity photosensitive cell for photoelectrically transducing incident light to electric signal charges. Each photo-sensor includes a primary and a secondary photosensitive cell respectively having higher-sensitivity and lower-sensitivity for photoelectrically transducing the incident light. Each microlens has its optical center shifted from the center of the corresponding photo-sensor toward the center of the photosensitive array.

27 Claims, 7 Drawing Sheets

SOLID-STATE IMAGE SENSOR WITH THE OPTICAL CENTER OF MICROLENSES SHIFTED FROM THE CENTER OF PHOTO-SENSORS FOR INCREASING THE CONVERGENCE RATIO

This Nonprovisional application claims priority under 35 U.S.C. § 119(a) on Patent Application No(s). 2002-323859 filed in JAPAN on Nov. 7, 2002, the entire contents of which are hereby incorporated by reference.

BACKGROUND OF THE INVENTION

1. Field of the Invention

The present invention relates to a solid-state image sensor having an array of photo-sensors, each of which has a set of photosensitive cells different in sensitivity from each other and a microlens converging incident light.

2. Description of the Background Art

As known in the art, a solid-state image sensor of the type is available which actualizes a broader dynamic range for using a primary and a secondary photosensitive cell, which are different in optical aperture area, i.e. photo-sensitivity, from each other. Because the optical aperture area, or opening region, of the primary photosensitive cells is broader, its sensitivity is heightened, and, however, the primary photosensitive cell cannot identify the level of the incident light exceeding a certain intensity level. On the other hand, because the opening region of the secondary photosensitive cell is smaller, its sensitivity is merely lowered, and, however, the secondary photosensitive cell, which does not become saturated as easily as the primary photosensitive cell, can more suitably detect the quantity of the incident light. Moreover, if the output signals of the couple of photosensitive cells are mixed with each other, pixel by pixel, an image signal having broader dynamic range is attained for each of photo-sensors.

Generally, the image signals outputted from the photo-sensors of the solid-state image sensor may involve shading to be irregular in quantity of light incident to the respective photo-sensors due to various causes. For example, in the image sensor type applied to imaging apparatus such as a digital camera, each of the photo-sensors has its own microlens arrayed to cause the incident light to converge so that the optical opening ratio of their photosensitive cells is essentially increased. However, the quantity of light incident to the respective photo-sensors is varies depending upon the incident angle of the light. More specifically, in the vicinity of the edge of a photosensitive array of the image sensor, the light incident to the photo-sensors is often inclined and the direction of the inclination is one-sided specifically to the edge, so that the quantity of the incident light is poorer than one incident to the photo-sensors located near the center of the frame. Consequently, in the vicinity of the edge of a picture picked up, the luminance of produced signals is poorer, thus resulting in shading. It is therefore a common practice with a digital camera of the type described above to use, e.g. digital processing and a memory to correct image signals involving shading, thereby simplifying a shading correcting circuit.

However, in the solid-state image sensor, if a set of photosensitive cells different in sensitivity from each other is arranged in each of photo-sensors corresponding to a particular pixel so that the dynamic range is broadened, the shading of the image signals cannot be adequately compensated for because the photoelectric transduction characteristic differs from one to another photosensitive cell. Co-pending U.S. patent application filed on Jul. 22, 2003 in the name of Naoki KUBO discloses a solid-state image pickup apparatus in which one photosensitive cell with the lower sensitivity of each of the photo-sensors, or pixel positions, is positioned at a side farther from the center of the photosensitive array, e.g. at the top right, top left, bottom right or bottom left portions of the array with respect to the other photosensitive cell with the higher sensitivity of that photosensor. The lower-sensitivity photosensitive cells are arranged generally symmetrically with respect to the center of the frame with the higher-sensitivity photosensitive cells intervening toward the center. With this configuration, it is possible to obviate the polarization of shading in the frame and execute the same shading correction on both of the higher- and lower-sensitivity photosensitive cells.

It is a common practice with the solid-state image sensor of the type described above to use, e.g. a solid-state image pickup apparatus such as a digital camera, thereby, with reference to FIG. 3, arranging the photo-sensors to form the photosensitive array 18 of the solid-state image sensor. In FIG. 3, in case an iris device, not shown, which is fitted on the light-incident, or subject, side of the photosensitive array 18, is set to a smaller iris value or the exit pupil position of an optics lens 34 is near to the photosensitive array 18, the light incident to the photosensitive array 18 with inclination is relatively increased. Particularly in the vicinity of the edge of the photosensitive array 18, the incident light is more inclined and more acute toward the edge.

FIG. 5 shows part of the photosensitive array 18 having a plurality of the photo-sensors 12 each corresponding to a particular pixel. Each of the photo-sensors 12 comprises a primary photosensitive cell 22 and a secondary photosensitive cell 24, and a microlens 52 is formed on each photo-sensor 12 to cause luminous flux, or incident light beam, to converge onto the couple of photosensitive cells 22 and 24. In FIG. 5, the light incident to the photosensitive array 18 is refracted by the microlenses 52 in dependence on the incident angle of the light, which makes it difficult that the luminous flux is incident to the photosensitive cells 22 and 24.

For example, with reference to FIG. 8, the light 602 is generally perpendicularly incident to the photosensitive array 18 to successfully converge by microlens 52, thus being incident a sufficiency of the luminous flux to both an opening region 62 of the primary photosensitive cell and an opening region 64 of the secondary photosensitive cell. On the other hand, with reference to FIGS. 9 and 10, the light 604 incident to the photosensitive array 18 is generally inclined to be refracted by the microlens 52. This causes the luminous flux incident to the respective opening regions 62 and 64 of the photosensitive cells 22 and 24 to be decreased so that a convergence ratio of the light is reduced. Particularly in the secondary photosensitive cell 24, because the opening region 64 is smaller, the convergence ratio of the cell 24 is often reduced and the sensitivity is further lowered.

As stated above, in the photosensitive array 18 of the solid-state image sensor 10, reduction in sensitivity of the photo-sensors is apt to occur particularly in the pixel positions where the incident light is inclined, thus involving the shading on the picture picked up. Depending on the incident angle of the luminous flux, the convergence ratio of the photosensitive cells 22 and 24 varies extensively, and therefore, the profile of shading may be varied.

When the incident light forms an image on the photosensitive array 18, a lens 34 of the optics captures the light to cause a blur circle 44, such as image circle, FIG. 4, to appear. If the luminous flux incident to the photosensitive array 18 is inclined as described above, then it converges to be shifted toward the edge direction of the photosensitive array 18. Therefore, with reference to FIG. 4, the blur circles 44 appear on the photosensitive array 18 at the position shifted from the opening regions 42 of the photo-sensors toward the edge direction of the photosensitive array 18. The closer the pixel positions to the edge of the photosensitive array 18, the more the blur circle 44 is shifted from the opening region 42 of the photo-sensor. With the photosensitive array 18 having photo-sensors 12, each of which has the secondary photo-sensitive cell 24 arranged upward in FIG. 5 with respect to the primary photosensitive cell 22, the blur circle 44 appears, as shown in FIG. 4, thus rendering the convergence ratio of the secondary photosensitive cells 24 lowered particularly in the pixel positions near the lower part of the photosensitive array 18.

FIG. 9 shows one of the photo-sensors 12 positioned near the upper portion of the photosensitive array or imaging frame 18. In the photo-sensor 12, if the more incident light 604 is inclined, the less luminous flux is incident to the respective opening regions 62 and 64 of the photosensitive cells 22 and 24. However, the opening region 62 of the primary photosensitive cell 22 has larger photosensitive area, and the opening region 64 of the secondary photosensitive cell 24 is positioned near the edge of the photosensitive array-18, i.e. on the side at which the light is captured, so that the luminous flux is relatively efficiently captured. By contrast, FIG. 10 shows one of the photo-sensors 12 positioned near the lower part of the imaging frame 18, wherein the luminous flux converging by microlens 52 is easily incident to the opening region 62 of the primary photosensitive cell 22. However, this luminous flux converging by microlens 52 is difficult, and may not, be incident to the opening region 64 of the secondary photosensitive cell 24 because the incident angle is acute, thus reducing often the convergence ratio. Consequently, the quantity of the lights incident to the secondary photosensitive cells 24 thus differs between the upper and lower portions of the photosensitive array 18, thereby often involving the luminance shading which is asymmetrical on the upper and lower portions of a picture picked up.

SUMMARY OF THE INVENTION

It is an object of the present invention to provide a solid-state image sensor in which a lowering of the sensitivity of low-sensitivity cells is minimized, and the shading involving on the photosensitive array, especially in the vicinity of its edge, is minimized to prevent image quality from being degraded.

A solid-state image sensor of the present invention includes a photosensitive array capturing an optical image representative of a desired scene. The photosensitive array includes photo-sensors arranged in a direction of row and a direction of column, and microlenses causing incident light to converge to the corresponding photo-sensor. Each of photo-sensors corresponds to a particular pixel included in the photosensitive array. Each photo-sensor is made up of a higher- and a lower-sensitivity photosensitive cell for photoelectrically transducing incident light to electric signal charges. Each photo-sensor includes a primary and a secondary photosensitive cell having respectively higher-sensitivity and lower-sensitivity for photoelectrically transducing the incident light. Each of the microlenses has its optical center shifted from the center of the corresponding photo-sensor toward the center of the photosensitive array.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Preferred embodiments of the solid-state image sensor in accordance with the present invention will be described hereinafter. Briefly, in the illustrative embodiments described, each of the photo-sensors forming a photosensitive array includes a set of, e.g. a pair of, photosensitive cells and a microlens. The photoelectric sensitivity, or transduction efficiency, of the photosensitive cells differs from each other in terms of the size of the opening regions, or optical aperture areas. This successfully broadens the dynamic range.

Further, the microlenses of the photo-sensors causing light to respectively converge to the opening regions of the photosensitive cells are conveniently formed so that each of the microlenses has its center shifted from the center of the photo-sensor. Consequently, particularly in vicinity of the edges of the photosensitive array, the convergence or concentration ratio of the photosensitive cells, especially low-sensitivity cells, is increased, thereby reducing the degradation of the sensitivity and the shading in luminance of the photo-sensors to prevent image quality from falling.

Figure 1:
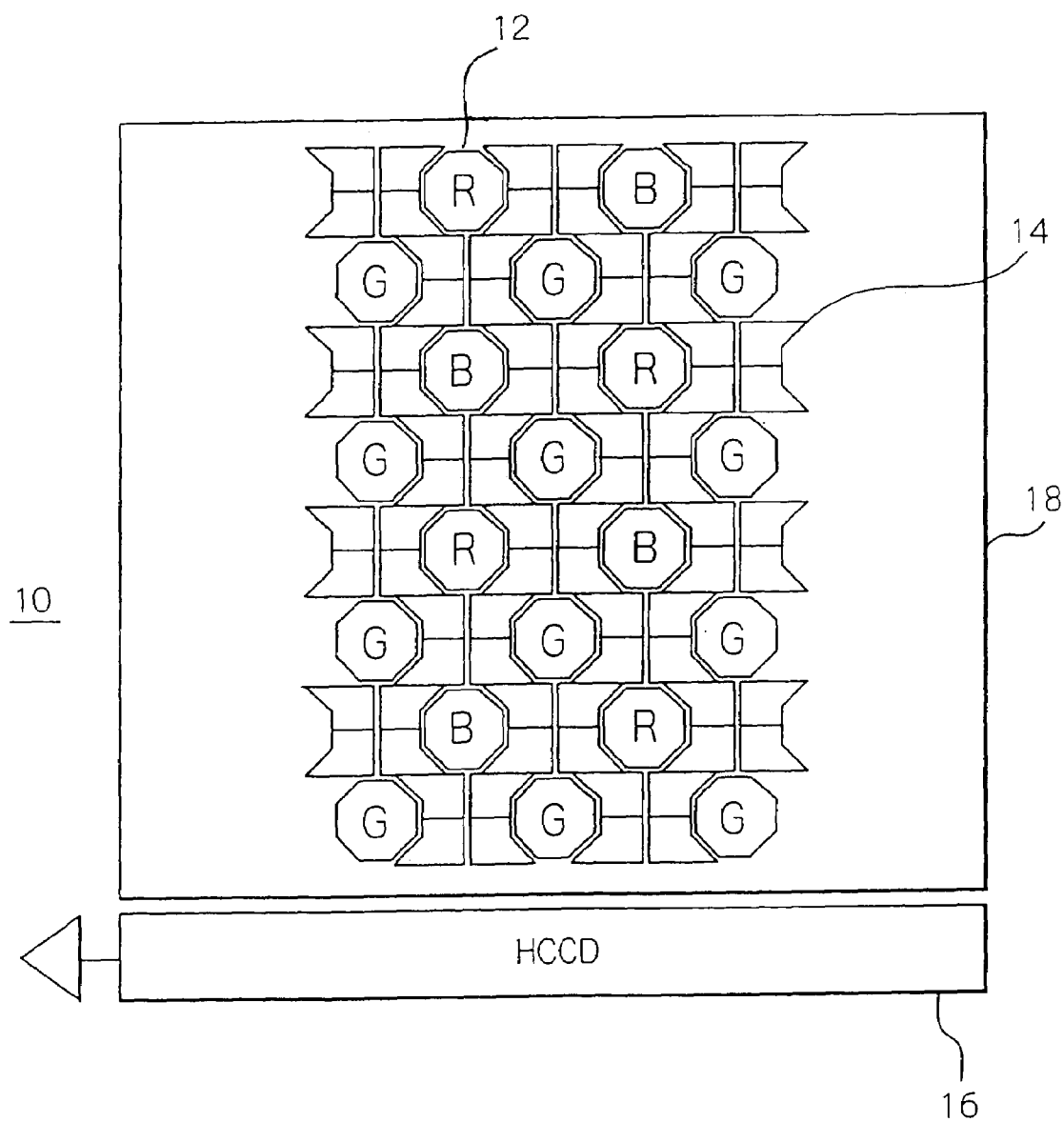
FIG. 1 is a fragmentary plan view schematically showing part of the photosensitive array of a solid-state image sensor embodying the present invention.

Referring to FIG. 1 of the drawings, a solid-state image sensor embodying the present invention is generally designated by the reference numeral 10. As shown, the solid-state image sensor 10 includes a photosensitive array 18 forming a picture to be picked up and a horizontal transfer path (H (Horizontal) CCDs) 16. The photosensitive array 18 includes a plurality of the photo-sensors 12, each of which corresponds to a particular pixel, and vertical transfer paths (V (Vertical) CCDs) 14. The solid-state image sensor 10 is generally constructed so that the light incident from a desired scene converges onto the photosensitive array 18, e.g. by the optics lens provided on the outside of the image sensor 10, to focus an optical image representative of the desired scene on the photosensitive array 18. The image sensor 10 may be implemented by, e.g. a CCD image sensor or a CMOS (Complementary Metal Oxide Semiconductor) image sensor.

Figure 2:
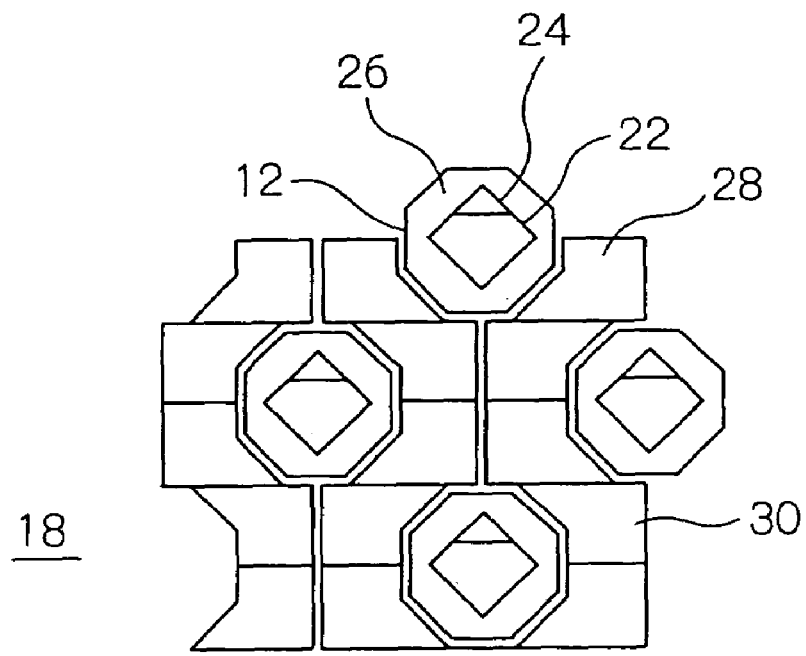
FIG. 2 is also a fragmentary plan view schematically showing part of the photosensitive array of the embodiment shown in FIG. 1, as seen from the light incident side.

The photo-sensors 12 photoelectrically transduce the incident light to output image signals corresponding to respective pixels. As shown in FIG. 2, each photo-sensor 12 is made up of a primary photosensitive cell 22, a secondary photosensitive cell 24 and a light shielding member 26. While each photo-sensor 12 is shown as being substantially square, it may be differently polygonal or circular, if desired. The photo-sensors 12 are arranged in rows and columns on the photosensitive array 18. Further, as shown in FIG. 1, each photo-sensor 12 has one of color filter segments R, G and B filtering selectively red, green and blue of the trichromatic colors, respectively.

More specifically, with reference to FIG. 1, the photo-sensors 12 are arranged in a so-called honeycomb pattern on the photosensitive array 18. In other words, every other row or column of photo-sensors 12 are shifted from each other. Stated in another way, each photo-sensor 12 is shifted from nearby photo-sensors 12 by a distance substantially equal to the half of the pitch of the photo-sensors in the horizontal or vertical direction. Alternatively, the image sensor 10 may be adapted such that the photo-sensors 12 are arranged in a substantially square matrix at a fixed pitch in the directions of row and column, if desired. The honeycomb pattern may be a G square lattice and RB complete checkered pattern so that the color filter segments G are arranged in a square matrix while the color filter segments R and B are arranged in a complete checker alternately in the other square matrix shifted from the matrix of the filter segments G so as to diagonally stride over the filter segments G. FIGS. 1 and 2 show only part of a number of pixels arranged in the photosensitive array 18 for the sake of simplicity of illustration.

The photosensitive array 18 has its light incident side covered with the light shielding member 26 except for parts corresponding to the photo-sensors 12. Each photo-sensor 12 catches the incident light via the optical through region, or the opening region, formed to be enclosed by the light shielding member 26 to be illuminated with the filtered light. In the illustrative embodiment, as shown in FIG. 2, each photo-sensor 12 has the opening region to illuminate both the primary photosensitive cell 22 and the secondary photosensitive cell 24. In the opening region, the entire, opened area is photosensitive. The sensitivity of each photosensitive area depend on the size of opened area, and therefore, if the opening regions of the photosensitive areas differing in size from each other are illuminated with the incident light of the identical quantity to each other, then the photoelectric transduction efficiencies of the opening regions differ from each other.

Each primary photosensitive cell 22 is a higher-sensitivity photosensitive cell which has a larger opening region than the other region in a single pixel, i.e. has a larger opening ratio. On the other hand, each secondary photosensitive cell 24 is a lower-sensitivity photosensitive cell which has a smaller opening region than the higher-photosensitivity region in a single pixel, i.e. has a smaller opening ratio. The photosensitive cells 22 and 24 photoelectrically transduce the quantity of the incident light thereto to a corresponding electric signal and may be implemented by, e.g. a photodiode. The secondary photosensitive cell 24 of each photosensor 12 is positioned at one side in the figure, of the primary photosensitive cell 22, as illustrated.

The vertical transfer paths (V (Vertical) CCDs) 14 is fitted on the photosensitive array 18 in zigzags verticality so as to a void the photo-sensors. The VCCDs 14 are charge coupled devices, which are formed to adjoin to the planar contour of the primary photosensitive cell 22 and the secondary photosensitive cell 24 in the area covered with the light shielding member 26. The signal charges generated by the photosensitive cells are read out to the VCCDs 14 and then sequentially transferred to the horizontal transfer path (H (Horizontal) CCDs) 16 in response to the control signal, or the vertical drive pulses, from the outside. The VCCDs 14, with reference to FIG. 2, include two layers of polycrystalline silicon electrodes of comprising a first polycrystalline silicon layer 28 (1 poly) and a second polycrystalline silicon layer 30 (2 poly), which may transfer the signal charges from the primary photosensitive cells 22 and the secondary photosensitive cells 24, respectively. Subsequently, the signal charges are sequentially transferred over the horizontal transfer path in the horizontal direction, i.e. toward the output side, in response to the control signal, or the horizontal drive pulses, supplied from the outside.

Each photo-sensor 12 in the photosensitive array 18 includes the microlens 52 having an optical function. The microlens 52 causes successfully the light incident to converge or concentrate to the photosensitive array 18, pixel by pixel, so that the light is incident to the opening region of each photo-sensor 12, thus increasing essentially the opening ratio of each photo-sensor 12. The microlens 52 is disposed so as to cover the corresponding photo-sensor 12. The microlens 52 has its optical center generally coaxial with the center of the opening region of that photo-sensor 12. However, in the illustrative embodiment, as shown in FIG. 6, the optical center of the microlens 52 of each photo-sensor 12 positioned near the edge of the photosensitive array 18 is shifted toward the secondary photosensitive cell 24.

Figure 3:
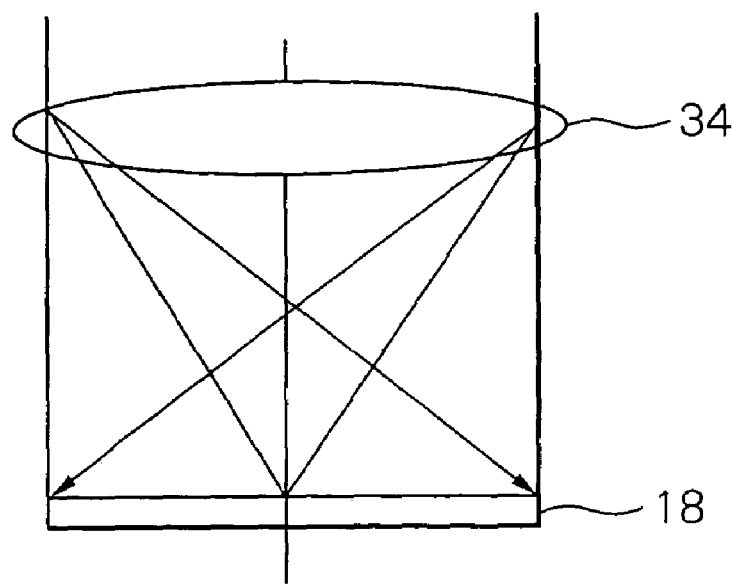
FIG. 3 schematically shows in a side view the photosensitive array and the optical lens therefor of the embodiment shown in FIG. 1.
Figure 4:
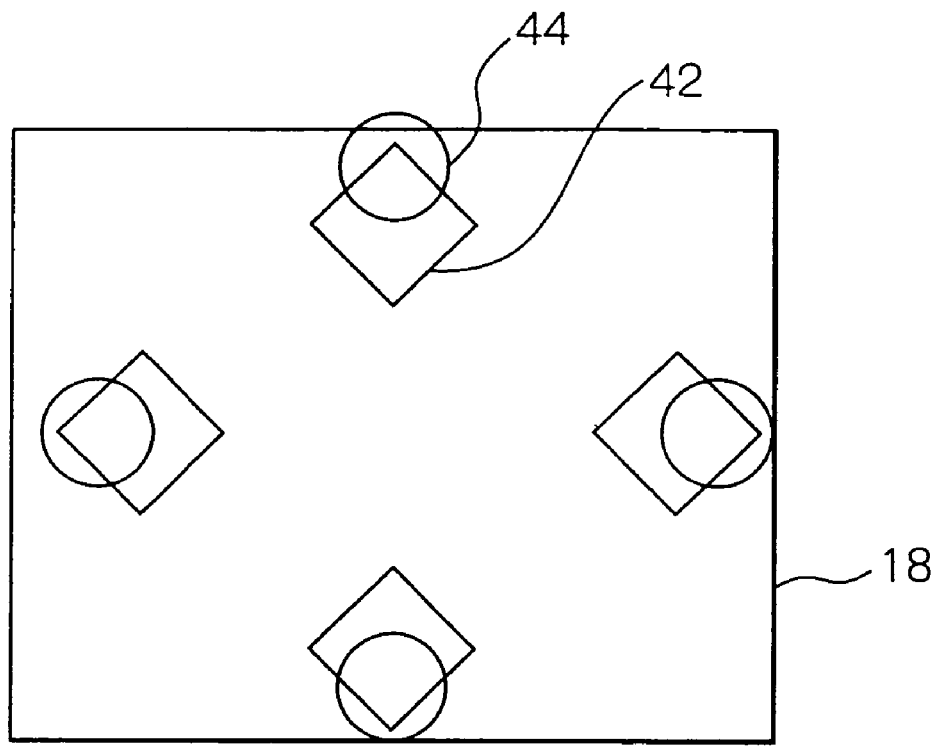
FIG. 4 is a fragmentary plan view schematically showing the photosensitive array of a solid-state image sensor of background art, with blur circles appearing near the opening region of the photo-sensors.
Figure 5:
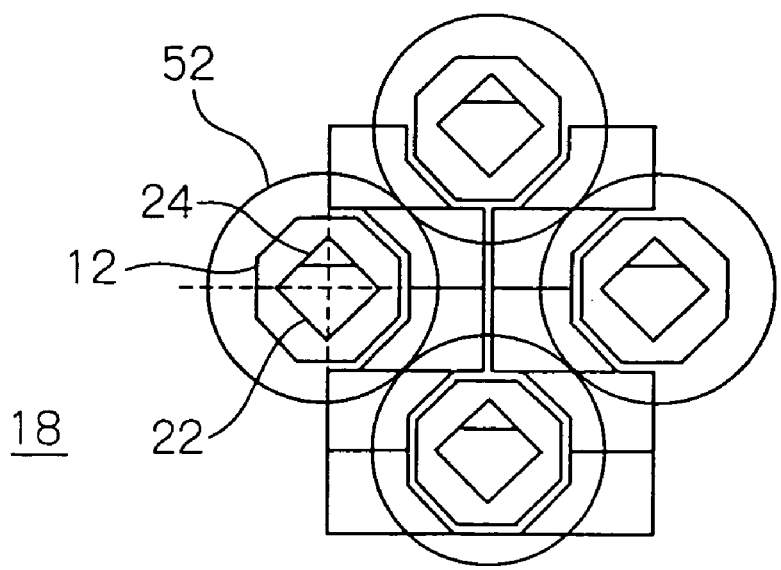
FIG. 5 is a fragmentary plan view schematically showing the photo-sensors with a microlenses on part of the photosensitive array of background art, as seen from the light incident side.

The solid-state image sensor 10 is used for, e.g. the solid-state image pickup apparatus, or the digital camera, to focus an optical image representative of the desired scene on the photosensitive array 18. As shown in FIG. 3, the light incident to this solid-state image pickup apparatus can converge by the optical lens 34 to illuminate the photosensitive array 18.

Then, the light incident to the photosensitive array 18 further converges by the microlenses 52 to be incident toward the photo-sensor 12 corresponding to a particular pixel so that the image signal is provided pixel by pixel. Subsequently, the incident light is filtered through the color filter segment R, G or B to be incident to the primary photosensitive cell 22 and the secondary photosensitive cell 24 of each photo-sensor 12 to be transduced photoelectrically, thereby generating the signal charges filtered out by the color filter segment.

Figure 6:
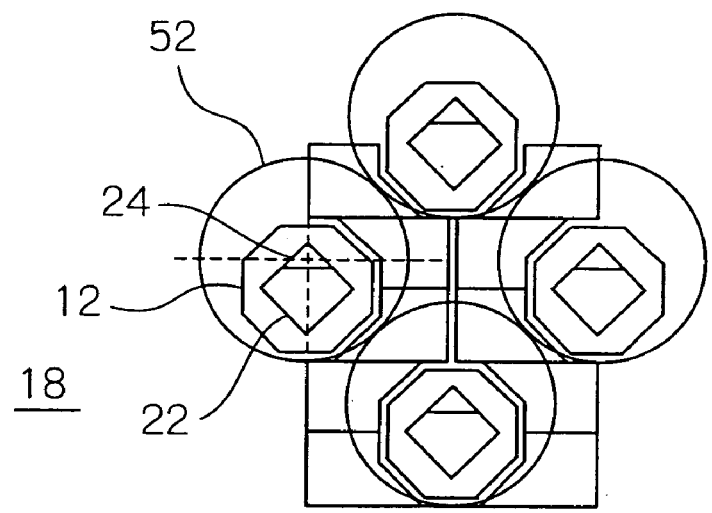
FIG. 6 is also a fragmentary plan view schematically showing the photo-sensors with microlenses provided on part of the photosensitive array of the illustrative embodiment, as seen from the light incident side.
Figure 11:
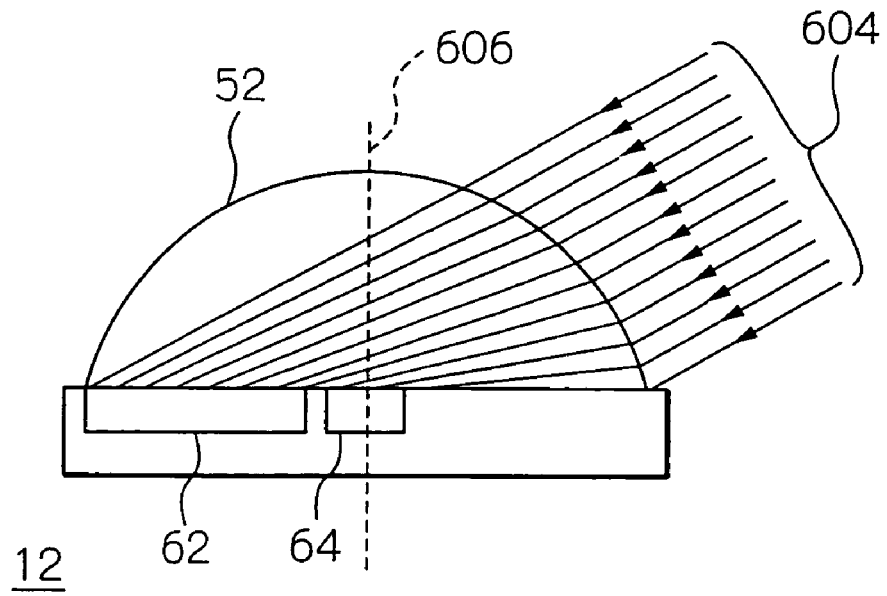
FIG. 11 schematically shows a photo-sensor with a microlens shifted toward the secondary photosensitive cell on the upper portion of the photosensitive array of the embodiment shown in FIG. 1.

In the illustrative embodiments, as shown in FIG. 6, the microlens 52 of each photo-sensor 12 is formed to shift its optical center toward the side of the secondary photosensitive cell 24. If the secondary photosensitive cell 24 is arranged to be shifted toward the upper side of the primary photosensitive cell 22 as seen in FIG. 6, particularly in the lower part of the photosensitive array 18, as shown in FIG. 11, the light 604 incident incliningly thereto successively converges by the microlens 52 to increase the luminous flux converging onto not only the opening region 62 of the primary photosensitive cell 22 but also the opening region 64 of the secondary photosensitive cell 24. Then, the primary photosensitive cell 22 and the secondary photosensitive cell 24 of the photo-sensors 12 positioned in the vicinity of the center and in the upper part of the photosensitive array 18, if they have the microlenses 52 formed with the optical center thereof nearly coincident with the center of the opening region of the photo-sensors 12, have a higher convergence ratio so that the microlens 52 may be less shifted.

As stated above, in each photo-sensor 12 of the photosensitive array 18 of the solid-state image sensor 10 of the present invention, if the secondary photosensitive cell 24 is arranged at one side of the primary photosensitive cell 22, the microlens 52 is formed to shift its optical center to the side of the secondary photosensitive cell 24 of the photo-sensor 12 so that the convergence ratios of the primary photosensitive cell 22 and the secondary photosensitive cell 24 are increased. In that case, the microlenses 52 may be arranged in such a fashion that the photo-sensors 12 nearer to the edge of the photosensitive array 18 have the microlenses 52 with the center thereof shifted to the further extent. In addition, the microlenses 52 may also be arranged in such a fashion that the photo-sensors 12 which are located nearer to the center of the photosensitive array 18 have the secondary photosensitive cell 24 thereof shifted toward the edge side on the photosensitive array 18 with respect to the primary photosensitive cell 22 have the microlenses 52 thereof less shifted. In the illustrative embodiment, the photo-sensors 12 located at the positions otherwise involving a poorer convergence ratio thus have the microlenses 52 shifted nearer the center of the photosensitive array 18 to increase the convergence ratio.

Further, the microlenses 52 may be shifted to adjust the optical center thereof to the center of the corresponding secondary photosensitive cells 24. In an alternative embodiment, each photo-sensor 12 is formed so that the primary photosensitive cell 22 is located at the side near the center of the photosensitive array 18 while the secondary photosensitive cell 24 is located at the side farther from the center of the photosensitive array 18, e.g. at the top right, the top left, the bottom right or the bottom left of the imaging frame or the photosensitive array 18 with respect to the primary photosensitive cell 22 of that photo-sensor.

For example, the secondary photosensitive cells 24 arranged on the upper and lower sides of the photosensitive array 18 are respectively located downward and upward the primary photosensitive cells 22 associated therewith so that the microlenses 52 and the secondary photosensitive cells 24 are generally arranged symmetrically with respect to the center of the photosensitive array 18 so as to balance themselves between the upper and the lower sides, thus preventing the convergence ratios from differing between the upper and lower sides. Still alternatively, the secondary photosensitive cell 24 in each photo-sensor 12 may be located near the edge side of the photosensitive array 18 with respect to the primary photosensitive cell 22 so that the microlenses 52 and the secondary photosensitive cells 24 are arranged concentrically around the center of the photosensitive array 18, thus increasing the convergence ratios of the photo-sensors 12 on the entire photosensitive array 18.

An alternative embodiment of the present invention will be described hereinafter with reference to FIG. 7. Briefly, with the instant embodiment, in the solid-state image sensor 10, the microlens 52 of each of the photo-sensors 12 located near the edge of the photosensitive array 18 is shifted toward the center of the photosensitive array 18, thereby decreasing the reduction of the sensitivity and the shading encountered at the edge of the photosensitive array 18.

Figure 7:
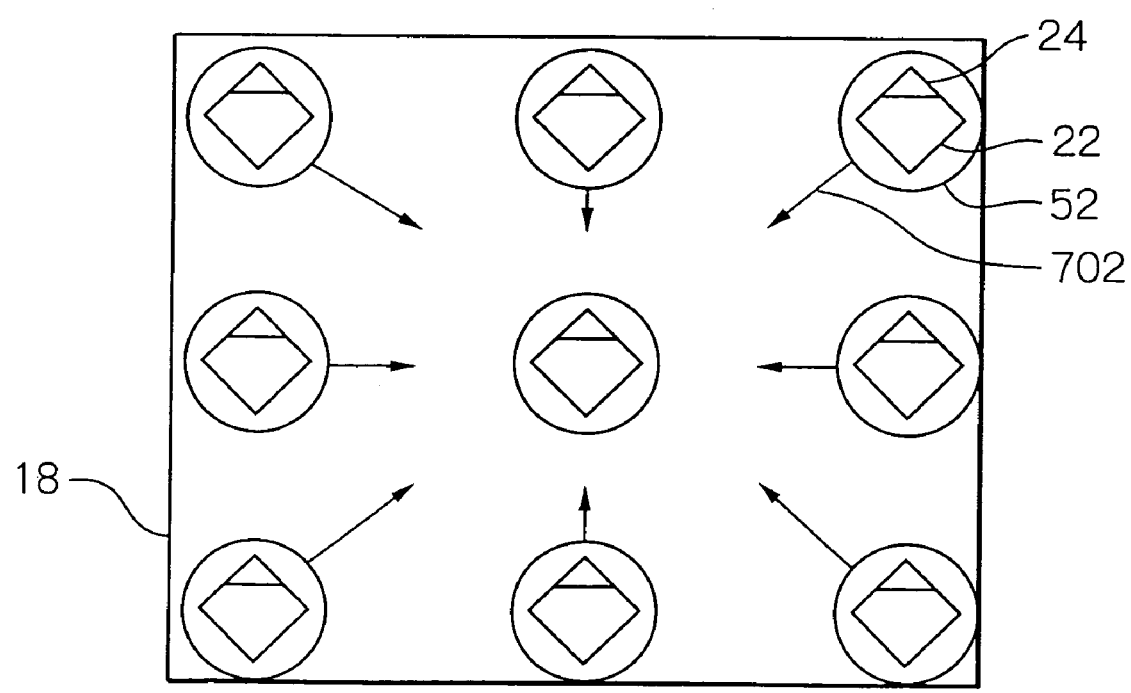
FIG. 7 is a further fragmentary plan view schematically showing microlenses and useful for understanding the direction and the extent of the microlenses shifting on the photosensitive array of the illustrative embodiment.
Figure 8:
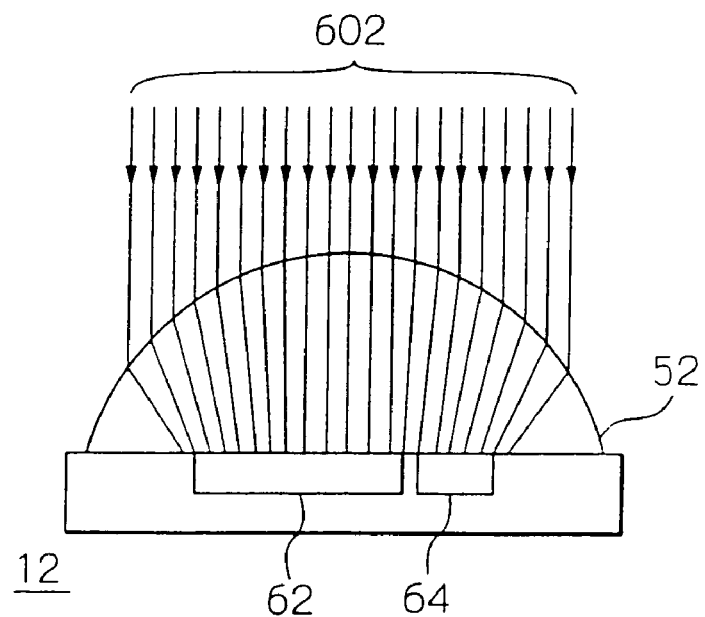
FIG. 8 schematically shows a photo-sensor with a microlens on the photosensitive array of background art, with the light being incident perpendicularly.
Figure 9:
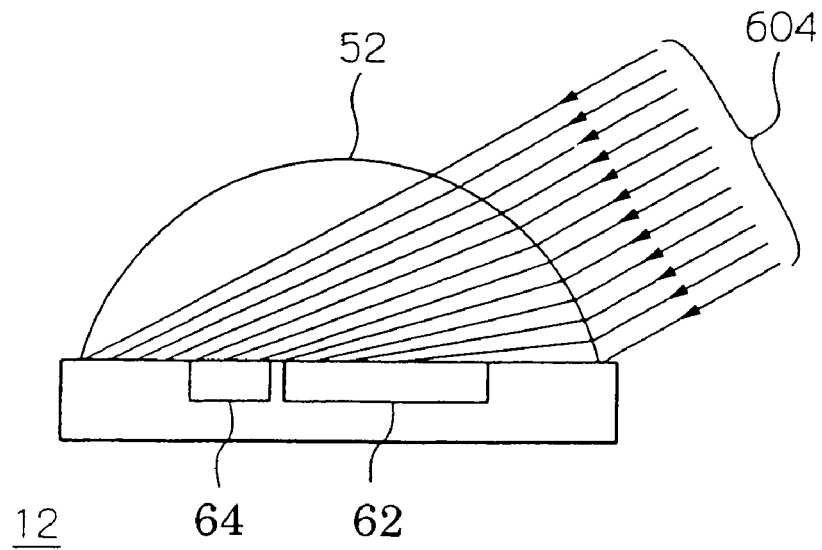
FIG. 9 schematically shows a photo-sensor with a microlens on the upper portion of the photosensitive array of the background art.
Figure 10:
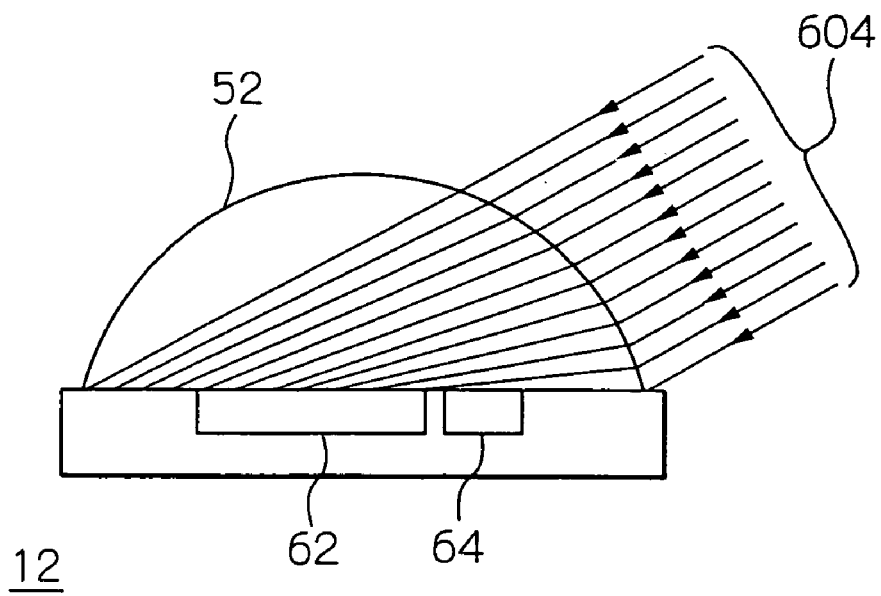
FIG. 10 schematically shows a photo-sensor with a microlens on the lower portion of the photosensitive array of the background art.
Figure 12:
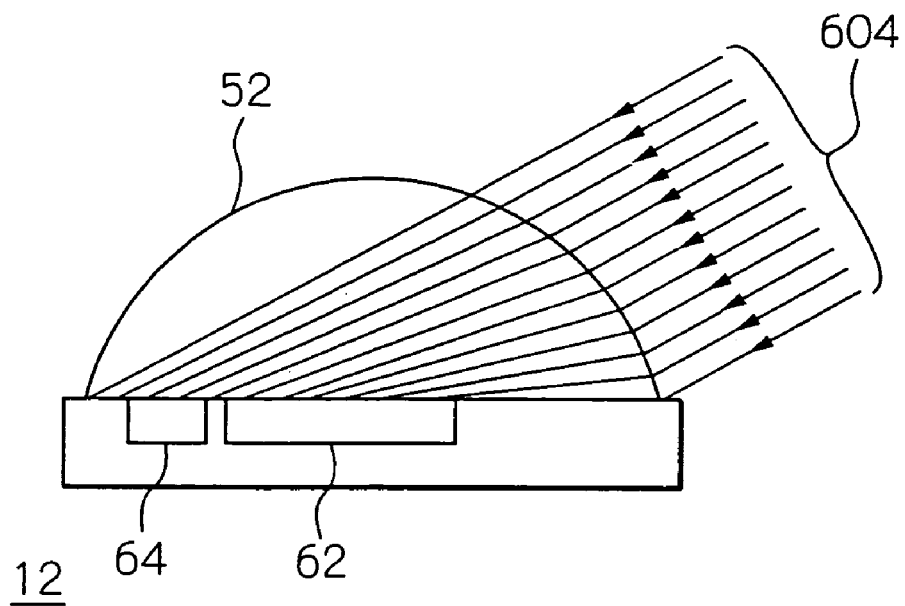
FIG. 12 schematically shows a photo-sensor with a microlens shifted toward the center of the photosensitive array on the upper portion of the photosensitive array of the illustrative embodiment.
Figure 13:
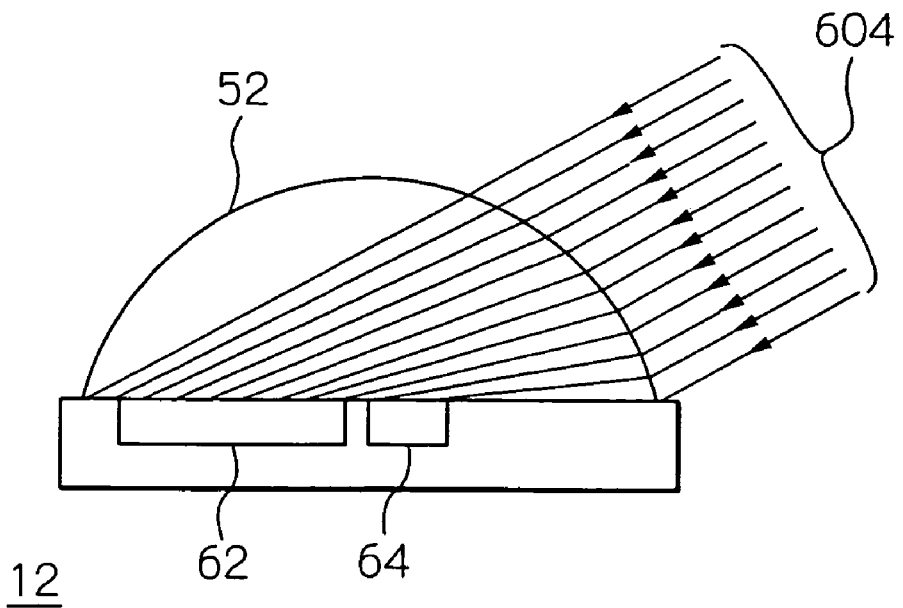
FIG. 13 schematically shows a photo-sensor with a microlens shifted toward the center of the photosensitive array on the lower portion of the photosensitive array of the illustrative embodiment.

For example, as shown in FIG. 7, the photo-sensors 12 nearer the center of the photosensitive array 18 have the microlenses 52 almost not shifted, and the other photo-sensors 12 nearer the edge of the photosensitive array 18 have the microlenses 52 shifted in the direction of arrows 702, i.e. the center of the microlens 52 is shifted from the center of the opening region of the photo-sensor 12 toward the center of the photosensitive array 18. Consequently, for example, with the photo-sensors 12 of the upper and lower sides of the photosensitive array 18 shown in FIGS. 12 and 13, respectively, the incident light beams 604 with inclination converge successfully by the microlenses 52 to be efficiently incident to the opening region 64 of the primary photosensitive cell 22 and the aperture region 64 of the secondary photosensitive cell 24, thus increasing the convergence ratio.

In the alternative embodiment stated above, if each of the photo-sensors 12 has its secondary photosensitive cell 24 located upward the primary photosensitive cell 22, the photo-sensors 12 located in the lower part of the photosensitive array 18 may have the microlens 52 thereof shifted larger than the microlens 52 of the other photo-sensors 12 located in the upper part of the photosensitive array 18. The length of the arrows in FIG. 7 symbolically indicates the quantity of the shifting. With this orientation, the convergence ratios of the lenses 52 in the upper and lower side of the photosensitive array 18 are prevented from substantially differing from each other.

Further, the microlenses 52 may be arranged in such a manner that the photo-sensors 12 nearer the edge and farther from the center of the photosensitive array 18 have the microlens 52 shifted to a further extent. This makes the convergence ratios of the photo-sensors 12 increase correspondingly to the influence of the incident light 604 with inclination to substantially equalize the quantity of light incident to the photo-sensors 12 on the entire area of the photosensitive array 18.

As stated above, in the latter, illustrative embodiment, the microlens 52 of each photo-sensor 12 is shifted, e.g. advantageously with the center of the microlens 52 shifted toward the secondary photosensitive cell 24 or toward the center of the photosensitive array 18, so that the incident light converges successfully by the microlens 52 onto not only the primary photosensitive cell 22 but also the secondary photosensitive cell 24 particularly in the vicinity of the edge of the photosensitive array 18 to sufficient capture the quantity of incident light. Consequently, reduced are the degradation in sensitivity of the photosensitive cells 22 and 24 and the shading on a picture picked up.

In summary, it has been seen that the present invention provides a solid-state image sensor having the optical center of the microlenses shifted from the center of the photo-sensors, thereby increasing the convergence ratio of the microlens of each photo-sensor. This solid-state image sensor has the photosensitive array formed in an array of photo-sensors, each of which has a set of photosensitive cells different in sensitivity from each other to broaden a dynamic range. Advantageously, the center of the microlens shifted toward the secondary photosensitive cell or the microlenses shifted toward the center of the photosensitive array allow not only the primary photosensitive sell but also the secondary photosensitive cell to sufficiently detect the quantity of the incident light. Therefore, the reduction and unevenness of the sensitivity can be decreased particularly in the secondary photosensitive cells. Further, the shading on a picture picked up can be reduced, particularly on its edge portions.

Because the solid-state image sensor of the present invention compensates for the shading by microlenses, a solid-state image pickup apparatus to which the image sensor is applied may consist in a simpler structure to save processor circuitry, such as a shading corrector.

The entire disclosure of Japanese patent application No. 2002-323859 filed on Nov. 7, 2002, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A solid-state image sensor comprising a photosensitive array for capturing incident light from a desired scene,
    said photosensitive array comprising a plurality of photo-sensors arranged in a direction of row and a direction of column, and microlenses formed respectively on the photo-sensors, each of said plurality of photo-sensors corresponding to a particular pixel included in the photosensitive array,
    each of said plurality of photo-sensors comprising a first photosensitive cell having first sensitivity for photo-electrically transducing the incident light, and a second photosensitive cell having second sensitivity lower than the first sensitivity for photoelectrically transducing the incident light,
    each of said microlenses causing the incident light to converge to both the first and second photosensitive cells of the corresponding photo-sensor,
    each of said microlenses having an optical center shifted from a center of corresponding one of said plurality of photo-sensors toward a center of said photosensitive array.

2. The sensor in accordance with claim 1, wherein each of said plurality of photo-sensors is arranged at a fixed pitch in the direction of row and the direction of column in a substantially square matrix.

3. The sensor in accordance with claim 1, each of said plurality of photo-sensors is shifted from adjoining one of said plurality of photo-sensors by a distance substantially corresponding to a half of a pitch between photo-sensors neighboring to each other in the direction of row and the direction of column.

4. The sensor in accordance with claim 1, wherein the second photosensitive cell of each of said plurality of photo-sensors is arranged at one side of the corresponding first photosensitive cell,
    in the photo-sensor having the second photosensitive cell arranged nearer to the center of the photosensitive array with respect to the first photosensitive cell, the optical center of the corresponding microlens being shifted toward the second photosensitive cell of the photo-sensor.

5. The sensor in accordance with claim 2, wherein the second photosensitive cell of each of said plurality of photo-sensors is arranged at one side of the corresponding first photosensitive cell,
    in the photo-sensor having the second photosensitive cell arranged nearer to the center of the photosensitive array with respect to the first photosensitive cell, the optical center of the corresponding microlens being shifted toward the second photosensitive cell of the photo-sensor.

6. The sensor in accordance with claim 3, wherein the second photosensitive cell of each of said plurality of photo-sensors is arranged at one side of the corresponding first photosensitive cell,
    in the photo-sensor having the second photosensitive cell arranged nearer to the center of the photosensitive array with respect to the first photosensitive cell, the optical center of the corresponding microlens being shifted toward the second photosensitive cell of the photo-sensor.

7. The sensor in accordance with claim 4, wherein said microlenses are arranged such that the photo-sensors nearer to an edge of said photosensitive array are shifted to a further extent.

8. The sensor in accordance with claim 5, wherein said microlenses are arranged such that the photo-sensors nearer to an edge of said photosensitive array are shifted to a further extent.

9. The sensor in accordance with claim 6, wherein said microlenses are arranged such that the photo-sensors nearer to an edge of said photosensitive array are shifted to a further extent.

10. The sensor in accordance with claim 4, wherein said first photosensitive cell and said second photosensitive cell of each of said plurality of photo-sensors are positioned closer to the center and the edge of the photosensitive array, respectively.

11. The sensor in accordance with claim 5, wherein said first photosensitive cell and said second photosensitive cell of each of said plurality of photo-sensors are positioned closer to the center and the edge of the photosensitive array, respectively.

12. The sensor in accordance with claim 6, wherein said first photosensitive cell and said second photosensitive cell of each of said plurality of photo-sensors are positioned closer to the center and the edge of the photosensitive array, respectively.

13. The sensor in accordance with claim 7, wherein said first photosensitive cell and said second photosensitive cell of each of said plurality of photo-sensors are positioned closer to the center and the edge of the photosensitive array, respectively.

14. The sensor in accordance with claim 8, wherein said first photosensitive cell and said second photosensitive cell of each of said plurality of photo-sensors are positioned closer to the center and the edge of the photosensitive array, respectively.

15. The sensor in accordance with claim 9, wherein said first photosensitive cell and said second photosensitive cell of each of said plurality of photo-sensors are positioned closer to the center and the edge of the photosensitive array, respectively.

16. A photosensitive array for use in an imaging sensor, comprising:
   a plurality of photo-sensors, wherein each photo-sensor comprises a primary and secondary photosensitive cells; and
   a plurality of microlenses formed over the plurality of photo-sensors,
   wherein each microlens is configured to converge luminous flux to both primary and secondary photosensitive cells of the corresponding photo-sensor,
   wherein an optical center of each microlens is shifted from a center of the corresponding photo-sensor, an amount of the shift being based on location of the corresponding photo-sensor relative to a center of the photosensitive array, and
   wherein a sensitivity to the luminous flux of the primary photosensitive cell is greater than a sensitivity to the luminous flux of the secondary photosensitive cell.

17. The photosensitive array of claim 16, wherein the optical center of each micro lens is shifted to maximize the convergence of the luminous flux to the corresponding secondary photosensitive cell.

18. The photosensitive array of claim 17, wherein the optical center of each micro lens nearer to a center of an opening of the corresponding secondary photosensitive cell than to a center of an opening of the corresponding primary photosensitive cell.

19. The photosensitive array of claim 16, wherein the amount of the shift of each microlens is proportional to a distance of the corresponding photo-sensor from the center of the photosensitive array.

20. The photosensitive array of claim 19, wherein the optical center of each microlens is closer to the center of the photosensitive array than the center of the corresponding photo-sensor.

21. The photosensitive array of claim 16, wherein for each photo-sensor, the secondary photosensitive cell is closer to the center of the photosensitive array than the primary photosensitive cell.

22. The photosensitive array of claim 21, wherein a line extending radially from the center of the photosensitive array intersects with both the optical center of the microlens and a center of an opening for the secondary photosensitive.

23. The photosensitive array of claim 16, wherein a relative positioning of the primary and secondary photosensitive cells for each photo-sensor is substantially fixed for the plurality of photo-sensors.

24. The photosensitive array of claim 23, wherein a line extending radially from the center of the photosensitive array intersects with both the optical center of the microlens and a center of an opening for the secondary photosensitive.

25. The photosensitive array of claim 16, wherein a relative positioning of the primary and secondary photosensitive cells for each photo-sensor on one side of a center line of the photosensitive array is reverse of a relative positioning of the primary and secondary photosensitive cells for each photo-sensor on other side of the center line of the photosensitive array.

26. The photosensitive array of claim 16, wherein the optical center of each microlens is closer to the center of the photosensitive array than the center of the corresponding photo-sensor.

27. The photosensitive array of claim 16, wherein the amount of the shift of the microlens is further based a relative positioning of the primary and secondary photosensitive cells of the corresponding photo-sensor.

* * * * *